(12) United States Patent (10) Patent No.: US 7,855,603 B1
Thor (45) Date of Patent: Dec. 21, 2010

(54) TEMPERATURE COMPENSATED SELF-BIAS DARLINGTON PAIR AMPLIFIER

(75) Inventor: Wei Yi Thor, Melaka (MY)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 12/493,527

(22) Filed: Jun. 29, 2009

(51) Int. Cl.
*H03F 3/04* (2006.01)

(52) U.S. Cl. ...................................... 330/296; 330/289

(58) Field of Classification Search ................. 330/285, 330/289, 291, 296
See application file for complete search history.

(56) References Cited

U.S. PATENT DOCUMENTS

| | | | |
|---|---|---|---|
| 5,859,568 A | 1/1999 | Le et al. | |
| 6,611,172 B1 | 8/2003 | Kobayashi et al. | |
| 6,972,630 B2 * | 12/2005 | Kobayashi | 330/296 |
| 7,142,058 B2 * | 11/2006 | Bokatius | 330/307 |

FOREIGN PATENT DOCUMENTS

| | | |
|---|---|---|
| CN | 101119100 A1 | 2/2008 |
| JP | 2000/124745 A | 4/2000 |

OTHER PUBLICATIONS

Gengler, Jeff, "General Purpose Amplifier Biasing", Freescale Semiconductor, AN3100, Rev. 2, Jul. 2008, pp. 1-4.

* cited by examiner

*Primary Examiner*—Khanh V Nguyen

(57) ABSTRACT

A Darlington pair amplifier includes a temperature compensation device. In one case, the device is a resistor connected in series between: (a) an intermediate node of two bias resistors for the Darlington pair, and (b) the control terminal of the Darlington pair. In another case, the device is a second, smaller, Darlington pair connected in series with the two bias resistors for the first Darlington pair. In still another case, the device is a combination of: (1) a resistor connected in series between: (a) an intermediate node of the two bias resistors for the Darlington pair, and (b) the control terminal of the Darlington pair; and (2) a second, smaller, Darlington pair connected in series with the two bias resistors for the first Darlington pair.

20 Claims, 11 Drawing Sheets

TEMPERATURE COMPENSATED SELF-BIAS DARLINGTON PAIR AMPLIFIER

BACKGROUND

So-called "Darlington pair" amplifiers are used in a wide variety of devices. As the term is used herein, a "Darlington pair" is a compound structure consisting of two transistors (either integrated or separate devices) connected in such a way that the current amplified by the first transistor is amplified further by the second transistor. In general, this configuration gives a much higher current gain than each transistor taken separately and, in the case of integrated devices, can take less space than two individual transistors because they can use a shared collector. Integrated Darlington pairs often come packaged in transistor-like integrated circuit packages.

FIG. 1 illustrates a first embodiment of a basic self-biased Darlington pair amplifier 100. Darlington pair amplifier 100 includes resistors 112, 114, 116 and 118, coupling capacitors 122 and 124, and transistors 132 and 134. Resistors 112 and 114 bias transistors 132 and 134. Resistor 112 also acts as a feedback resistor. Resistor 116 acts as a current limiter as well as for matching purposes. Resistor 118 also acts as a current limiter as well as to improve the linearity of the overall amplifier. The size of transistor 134 is normally larger than the size of transistor 132, and the currents through transistors 132 and 134 are proportional to the size ratio between them.

One problem with Darlington pair amplifier 100 is that across a wide range of temperature, the currents through transistors 132 and 134 change significantly. The voltage across the base-emitter junction (Vbe) of each of the transistors 132 and 134 decreases with increasing temperature, and vice versa. So, assuming that the resistor values do not change with temperature, the voltage across resistor 116 and resistor 118 is higher at high temperatures, due to the lower Vbe of transistors 132 and 134. Hence more current flows through the collectors of transistors 132 and 134 at high temperatures. At lower temperatures, the opposite holds true.

Depending on the process, the total current variation can be up to 50% of the nominal current at room temperature. This is obviously a big problem, as it also affects the RF performance of Darlington pair amplifier 100 over temperature.

FIG. 2 illustrates another embodiment of a basic self-biased Darlington pair amplifier 200 which includes temperature compensation. Darlington pair amplifier 200 is similar to Darlington pair amplifier 100, with the addition of diode-configured transistors 236 and 238, to bias the transistors 132 and 134. Compared to Darlington pair amplifier 100, the value of resistor 114 is reduced and provides an offset voltage required to bias transistors 132 and 134 to the desired current. Because the temperature characteristics of diode-configured transistors 236 and 238 are very similar to the characteristics of transistors 132 and 134, they operate as a temperature compensation circuit. However, because diode-configured transistors 236 and 238 are usually much smaller in size than transistors 132 and 134, the temperature characteristics between the diode-configured transistors 236 and 238 and transistors 132 and 134 do not exactly match. It is also important to place diode-configured transistors 236 and 238 and transistors 132 and 134 as close as possible to each other.

However, Darlington Pair Amplifier 200 has some disadvantages, particularly from the point of view of the RF performance. First, the input impedance match is significantly affected by the presence of diode-configured transistors 236 and 238. Second, diode-configured transistors 236 and 238 increase the overall Noise Figure (NF) of the amplifier.

What is needed, therefore, is a Darlington Pair Amplifier that can operate with reduced current variation versus temperature, while maintaining an acceptable input impedance match and noise figure.

SUMMARY

In an example embodiment, a device comprises: first and second transistors configured as a Darlington pair, the Darlington pair including an input node and an output node; first and second bias resistors connected in series between a first supply voltage and a second supply voltage, the first and second bias resistors defining an intermediate node in a current path between the first and second bias resistors; and a third resistor connected in series between the intermediate node and the input node of the Darlington pair.

In another example embodiment, a device comprises: first and second transistors configured as a first Darlington pair, the first Darlington pair including a first input node and a first output node; first and second bias resistors connected in series between a first supply voltage and an intermediate node, wherein the first input node of the first Darlington pair is disposed in a current path between the first and second bias resistors; and a bias circuit, including: third and fourth transistors configured as a second Darlington pair, the second Darlington pair including a second input node and a second output node connected to the intermediate node, and third and fourth bias resistors connected in series between the intermediate node and a second power supply voltage, wherein the second input node of the second Darlington pair is disposed in a current path between the third and fourth bias resistors.

In yet another example embodiment, a device comprises: first and second transistors configured as a first Darlington pair, the first Darlington pair including a first input node and a first output node; first and second bias resistors connected in series between a first supply voltage and a first intermediate node, the first and second bias resistors defining a second intermediate node in a current path between the first and second bias resistors; a bias circuit, including: third and fourth transistors configured as a second Darlington pair, the second Darlington pair including a second input node and a second output node connected to the first intermediate node, and third and fourth bias resistors connected in series between the first intermediate node and a second power supply voltage, wherein the second input node of the second Darlington pair is disposed in a current path between the third and fourth bias resistors; and a fifth resistor connected in series between the second intermediate node and the first input node of the first Darlington pair.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions shown in the drawings may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

Unless otherwise noted, when a first device is said to be connected to a second device, this encompasses cases where one or more intermediate devices may be employed to connect the two devices to each other. However, when a first device is said to be directly connected to a second device, this encompasses only cases where the two devices are connected to each other without any intermediate or intervening devices. Similarly, when a signal is said to be coupled to a device, this encompasses cases where one or more intermediate devices may be employed to couple the signal to the device. However, when a signal is said to be directly coupled to a device, this encompasses only cases where the signal is directly coupled to the device without any intermediate or intervening devices.

Figure 3:
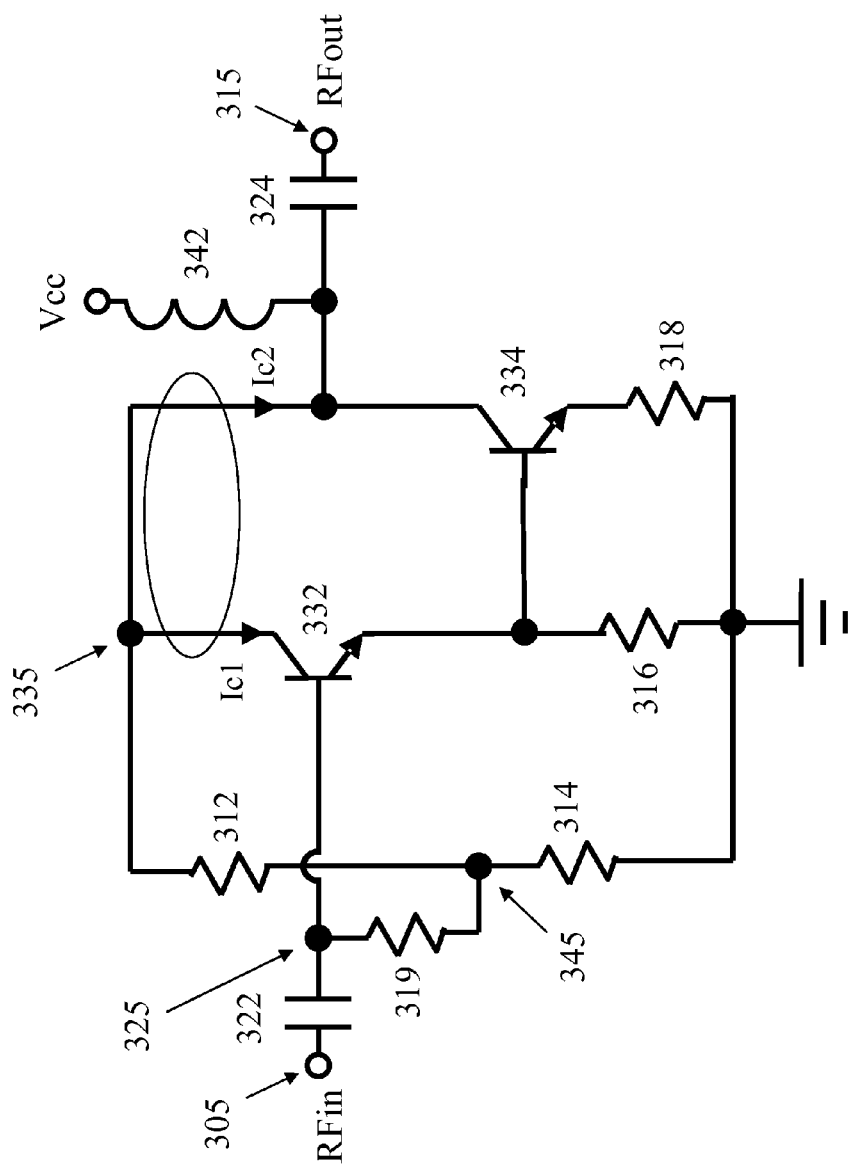
FIG. 3 shows a first embodiment of a temperature compensated Darlington pair amplifier.

FIG. 3 shows a first embodiment of a temperature compensated Darlington pair amplifier 300. Darlington pair amplifier 300 includes: input terminal 305; output terminal 315; first and second transistors 332 and 334 configured as a Darlington pair, the Darlington pair including an input node 325 and an output node 335; first and second bias resistors 312 and 314 connected in series between a first supply voltage ($V_{CC}$) and a second supply voltage (e.g., ground), the first and second bias resistors defining an intermediate node 345 in a current path between the first and second bias resistors 312 and 314; a third resistor 319 connected in series between intermediate node 345 and input node 325 of the Darlington pair; a capacitor 322 coupling input terminal 305 to input node 325 of the Darlington pair; and an output coupling circuit, comprising capacitor 324 and inductor 342, coupling output node 335 of the Darlington pair and output terminal 315 of Darlington pair amplifier 300.

In an alternative embodiment, a series combination of a capacitor and a resistor may be placed in parallel with first resistor 312 in order to improve the RF performance of Darlington pair amplifier 300.

Each of first and second transistors 332 and 334 has a base and an emitter and beneficially, first and second transistors 332 and 334 have a shared collector. Also beneficially, a fourth resistor 316 is connected between the emitter of first transistor 312 and the second power supply voltage (e.g., ground), and a fifth resistor 318 is connected between the emitter of second transistor 334 and the second power supply voltage (e.g., ground).

In one embodiment: resistor 312=1150 ohms; resistor 314=195 ohms; 316=80 ohms; and resistor 318=3.5 ohms.

Darlington Pair Amplifier 300 operates as follows. At higher temperatures, because of the increased collector currents in first and second transistors 332 and 334, the base current of first transistor 332 also increases. The only source of current for the base of first transistor 332 is through third resistor 319. Therefore, as the base current increases, the voltage across third resistor 319 increases as well, causing the base voltage of first transistor 332 (and hence second transistor 334) to drop, thereby reducing the overall collector current (Ic1+Ic2) of first and second transistors 332 and 334.

Thus it seen that third resistor 319 compensates for an increased collector current that would otherwise caused to flow through first and second transistors 332 and 334 as temperature increases, as explained with respect to the Darlington Pair Amplifier 100. Furthermore, third resistor 319 isolates the RF path from the DC bias circuit. This increases the gain of Darlington pair amplifier 300 (in one embodiment, approximately 2-3 dB) and improves the noise figure (NF).

If the value of third resistor 319 is too large, then first resistor 312 ceases to act as a feedback resistor, hence affecting the RF performance of Darlington pair amplifier 300. Therefore, beneficially third resistor 319 has a resistance value of 50-200 ohms. Also beneficially, the ratio of the sum of resistance values of first and second resistors 312 and 314, to the resistance value of third resistor 319, is about between 5:1 and 20:1.

Figure 2:
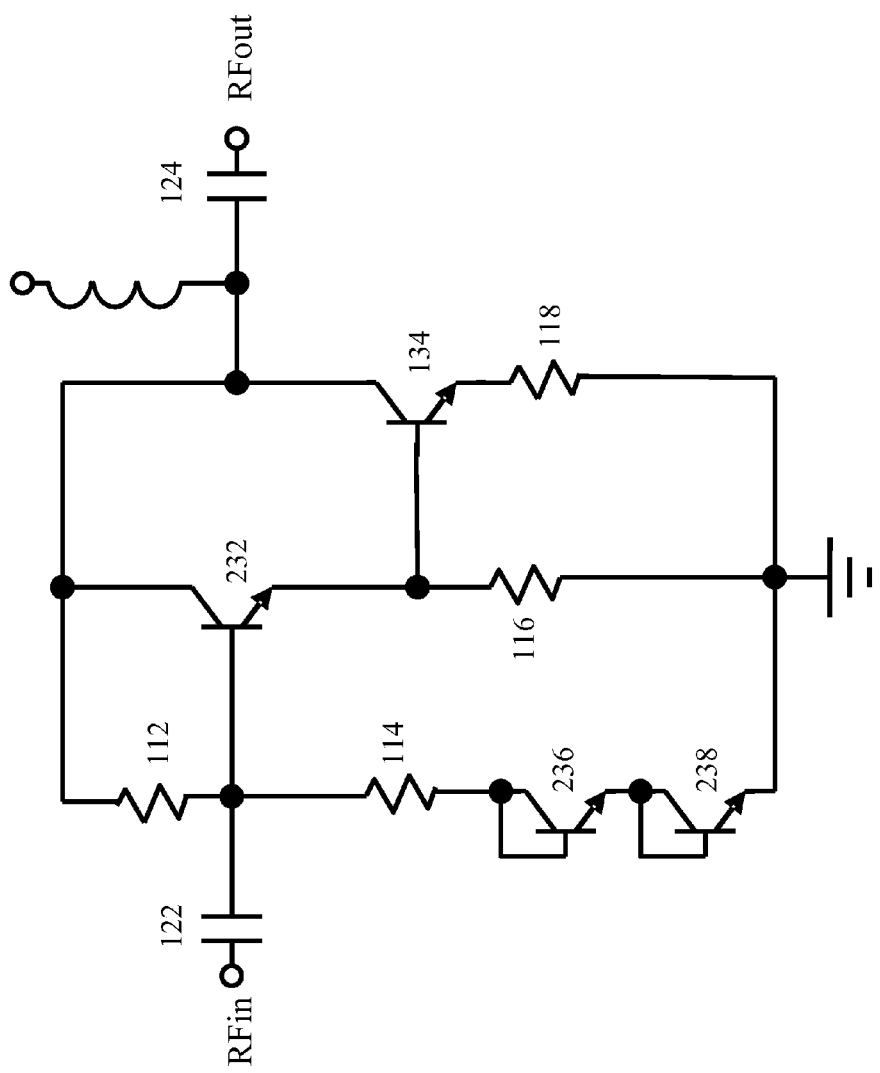
FIG. 2 shows another embodiment of a Darlington pair amplifier.

Variations of are possible. For example, in one embodiment a pair of diode-configured transistors similar to elements 236 and 238 of FIG. 2 are connected in series with second bias resistor 314 in the path between intermediate node 345 and the second supply voltage (e.g., ground).

Figure 4:
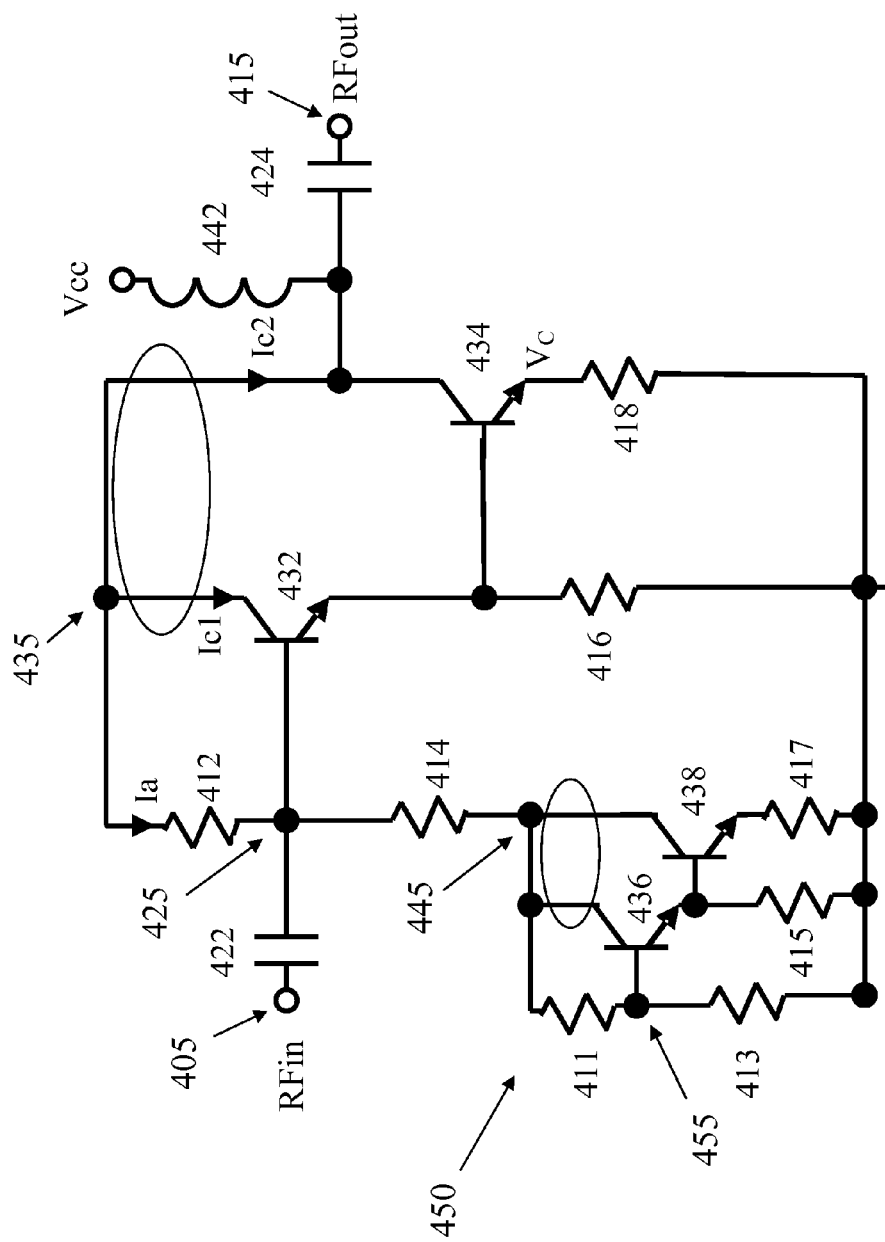
FIG. 4 shows a second embodiment of a temperature compensated Darlington pair amplifier.

FIG. 4 shows a second embodiment of a temperature compensated Darlington pair amplifier 400. Darlington Pair Amplifier 400 includes: input terminal 405; output terminal 415; first and second transistors 432 and 434 configured as a first Darlington pair, the first Darlington pair including a first input node 425 and a first output node 435; first and second bias resistors 412 and 414 connected in series between a first supply voltage ($V_{CC}$) and an intermediate node 445, wherein the first input node 425 of the first Darlington pair is disposed in a current path between the first and second bias resistors 412 and 414; a bias circuit 450, including: third and fourth transistors 436 and 438 configured as a second Darlington pair, the second Darlington pair including a second input node 455 and a second output node connected to intermediate node 445, and third and fourth bias resistors 411 and 413 connected in series between intermediate node 445 and a second power supply voltage (ground), wherein the second input node 455 of the second Darlington pair is disposed in a current path between the third and fourth bias resistors 411 and 413; a capacitor 422 coupling input terminal 405 to first input node 425 of the first Darlington pair; and an output coupling circuit, comprising capacitor 424 and inductor 442, coupling first output node 435 of the first Darlington pair and output terminal 415 of Darlington pair amplifier 400.

In an alternative embodiment, a series combination of a capacitor and a resistor may be placed in parallel with first resistor 412 in order to improve the RF performance of Darlington pair amplifier 400.

Each of first and second transistors 432 and 434 has a base and an emitter and beneficially, first and second transistors 432 and 434 have a shared collector. Also beneficially, a fifth resistor 416 is connected between the emitter of first transistor 432 and the second power supply voltage (e.g., ground), and a sixth resistor 418 is connected between the emitter of second transistor 434 and the second power supply voltage (e.g., ground). Furthermore, each of third and fourth transistors 436 and 438 has a base and an emitter and beneficially, third and fourth transistors 436 and 438 have a shared collector. Also beneficially, a seventh resistor 415 is connected between the emitter of third transistor 436 and the second power supply voltage (e.g., ground), and an eighth resistor 417 is connected between the emitter of fourth transistor 438 and the second power supply voltage (e.g., ground).

In one embodiment: resistor 412=1150 ohms; resistor 414=195 ohms; 416=80 ohms; resistor 418=3.5 ohms; resistor 411=40 ohms; resistor 413=5000 ohms; resistor 415=5000 ohms; and resistor 417 is very small. In one embodiment, resistor 417 may be deleted entirely so that the emitter of fourth transistor 438 is directly connected to ground.

Darlington pair amplifier 400 operates as follows. As already explained above, as the temperature increases, the collector current (Ic1+Ic2) through first and second transistors 432 and 434 configured as a first Darlington pair. Bias circuit 450, being of the same topology as the first Darlington pair, also draws more current as the temperature increases. The current drawn by bias circuit 450 is the same as the current, Ia, through first resistor 412. Therefore, the voltage drop across first resistor 412 also increases, reducing the base voltage of first transistor 432 (and hence second transistor 434). This effectively prevents the collector current (Ic1+Ic2) through first and second transistors 432 and 434 from increasing with temperature. When the temperature decreases, the opposite holds true.

Because the temperature characteristics of bias circuit 450 is very similar to the temperature characteristic of the first Darlington pair including first and second transistors 432 and 434, this temperature compensation method effectively maintains a constant current through first and second transistors 432 and 434 across a wide range of temperature.

Figure 5:
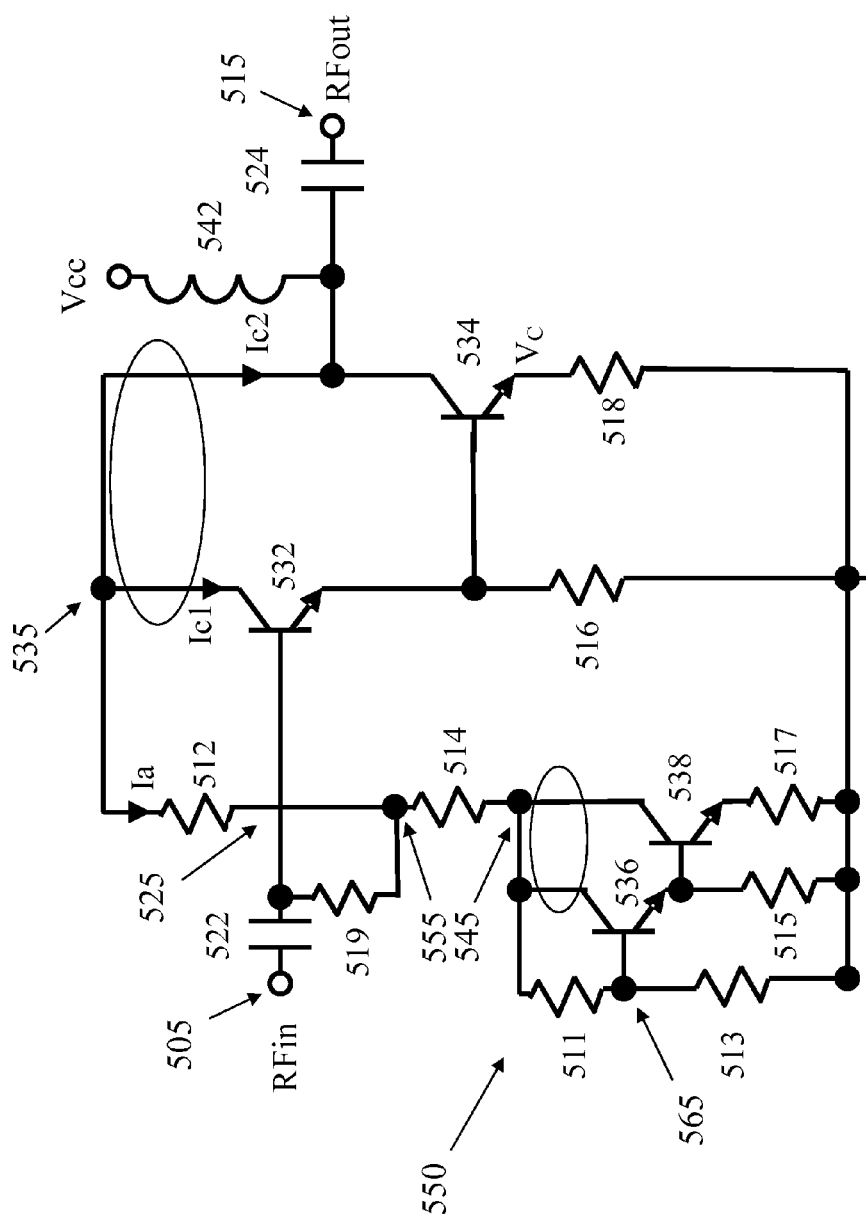
FIG. 5 shows a third embodiment of a temperature compensated Darlington pair amplifier.

FIG. 5 shows a third embodiment of a temperature compensated Darlington pair amplifier 500. Darlington pair amplifier 500 includes: input terminal 505; output terminal 515; first and second transistors 532 and 534 configured as a first Darlington pair, the first Darlington pair including a first input node 525 and a first output node 535; first and second bias resistors 512 and 514 connected in series between a first supply voltage ($V_{CC}$) and a first intermediate node 545, the first and second bias resistors 512 and 514 defining a second intermediate node 555 in a current path between the first and second bias resistors 512 and 514; a bias circuit 550, including: third and fourth transistors 536 and 538 configured as a second Darlington pair, the second Darlington pair including a second input node 565 and a second output node connected to first intermediate node 545, and third and fourth bias resistors 511 and 513 connected in series between first intermediate node 545 and a second power supply voltage (e.g., ground), wherein the second input node 565 of the second Darlington pair is disposed in a current path between the third and fourth bias resistors 511 and 513; a fifth resistor 519 connected in series between second intermediate node 555 and first input node 525 of the first Darlington pair; a capacitor 522 coupling input terminal 505 to first input node 525 of the first Darlington pair; and an output coupling circuit, comprising capacitor 524 and inductor 542, coupling first output node 535 of the first Darlington pair and output terminal 515 of Darlington pair amplifier 500.

In an alternative embodiment, a series combination of a capacitor and a resistor may be placed in parallel with first resistor 512 in order to improve the RF performance of Darlington pair amplifier 500.

Each of first and second transistors 532 and 534 has a base and an emitter and beneficially, first and second transistors 532 and 534 have a shared collector. Also beneficially, a sixth resistor 516 is connected between the emitter of first transistor 532 and the second power supply voltage (e.g., ground), and a seventh resistor 518 is connected between the emitter of second transistor 534 and the second power supply voltage (e.g., ground). Furthermore, each of third and fourth transistors 536 and 538 has a base and an emitter and beneficially, third and fourth transistors 536 and 538 have a shared collector. Also beneficially, an eighth resistor 515 is connected between the emitter of third transistor 536 and the second power supply voltage (e.g., ground), and a ninth resistor 517 is connected between the emitter of fourth transistor 538 and the second power supply voltage (e.g., ground).

In one embodiment: resistor 512=1150 ohms; resistor 514=195 ohms; 516=80 ohms; resistor 518=3.5 ohms; resistor 511=40 ohms; resistor 513=5000 ohms; resistor 515=5000 ohms; and resistor 517 is very small. In one embodiment, resistor 517 may be deleted entirely so that the emitter of fourth transistor 538 is directly connected to ground.

Beneficially, Darlington pair amplifier 500 shares benefits of Darlington pair amplifiers 300 and 400. Fifth resistor 519 isolates the RF path from the DC bias circuit. This increases the gain of Darlington pair amplifier 500 (in one embodiment, approximately 2-3 dB) and improves the noise figure (NF).

If the value of third resistor 519 is too large, then first resistor 512 ceases to act as a feedback resistor, hence affecting the RF performance of Darlington pair amplifier 500. Therefore, beneficially third resistor 519 has a resistance value of 50-200 ohms. Also beneficially, the ratio of the sum of resistance values of first and second resistors 512 and 514, to the resistance value of third resistor 519, is about 10:1 or more.

Figure 1:
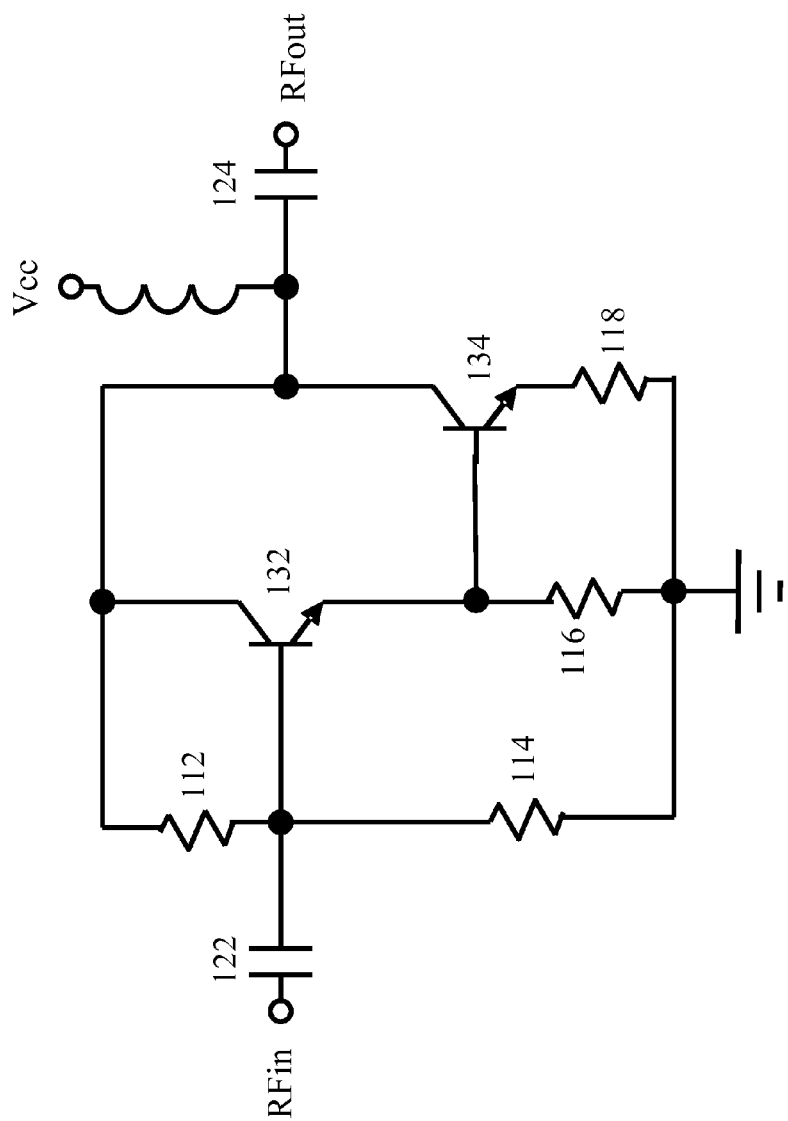
FIG. 1 shows one embodiment of a Darlington pair amplifier.
Figure 6:
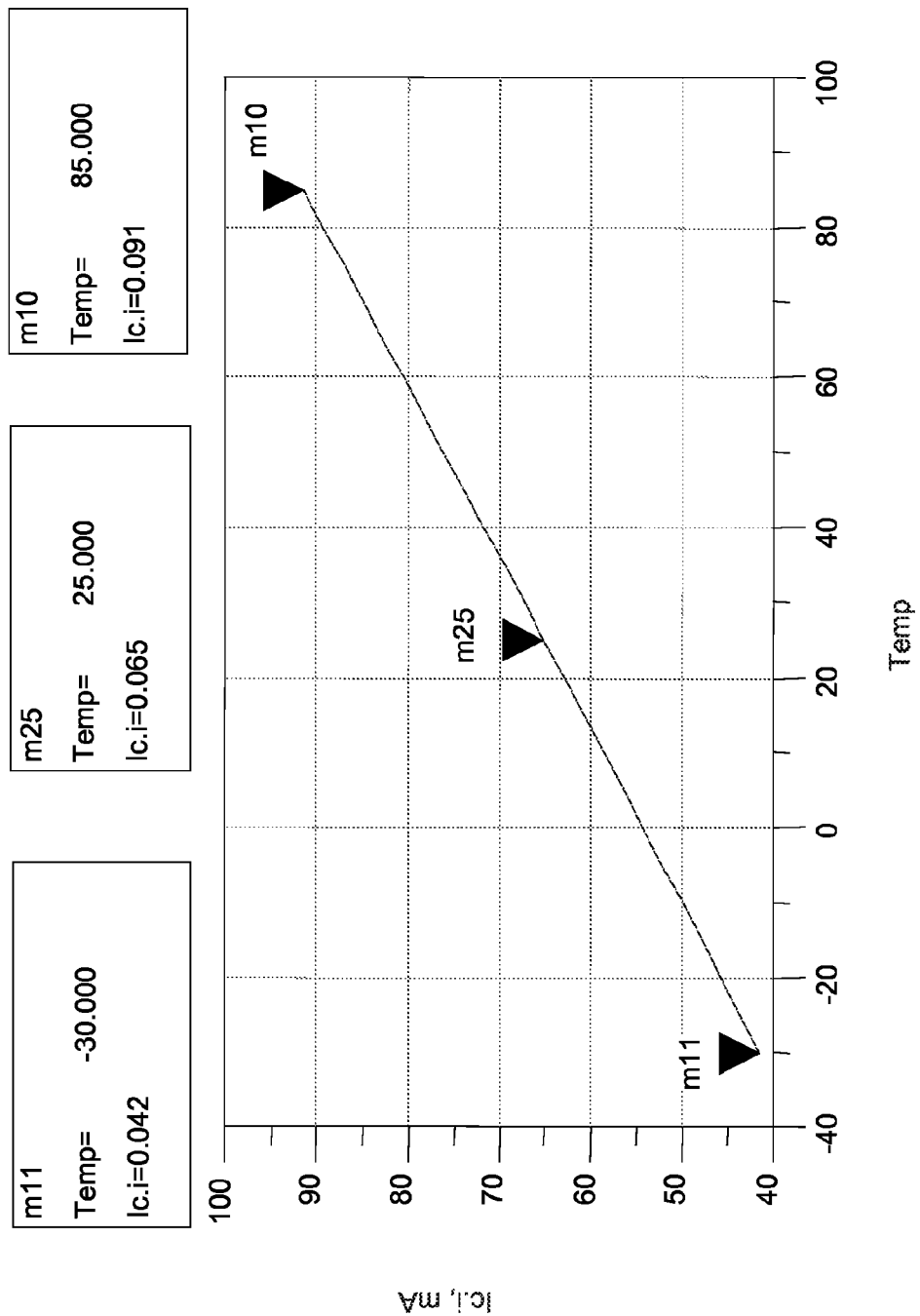
FIG. 6 illustrates the collector current versus temperature performance of one embodiment of a basic Darlington Amplifier, such as that shown in FIG. 1.

FIG. 6 illustrates the collector current versus temperature performance of one embodiment of a basic Darlington pair amplifier such as Darlington pair amplifier 100 shown in FIG. 1. As can be seen, over a temperature range of −30° C. to +85° C., the overall collector current (Ic1+Ic2) of first and second transistors 132 and 134 varies ≈±40%.

Figure 7:
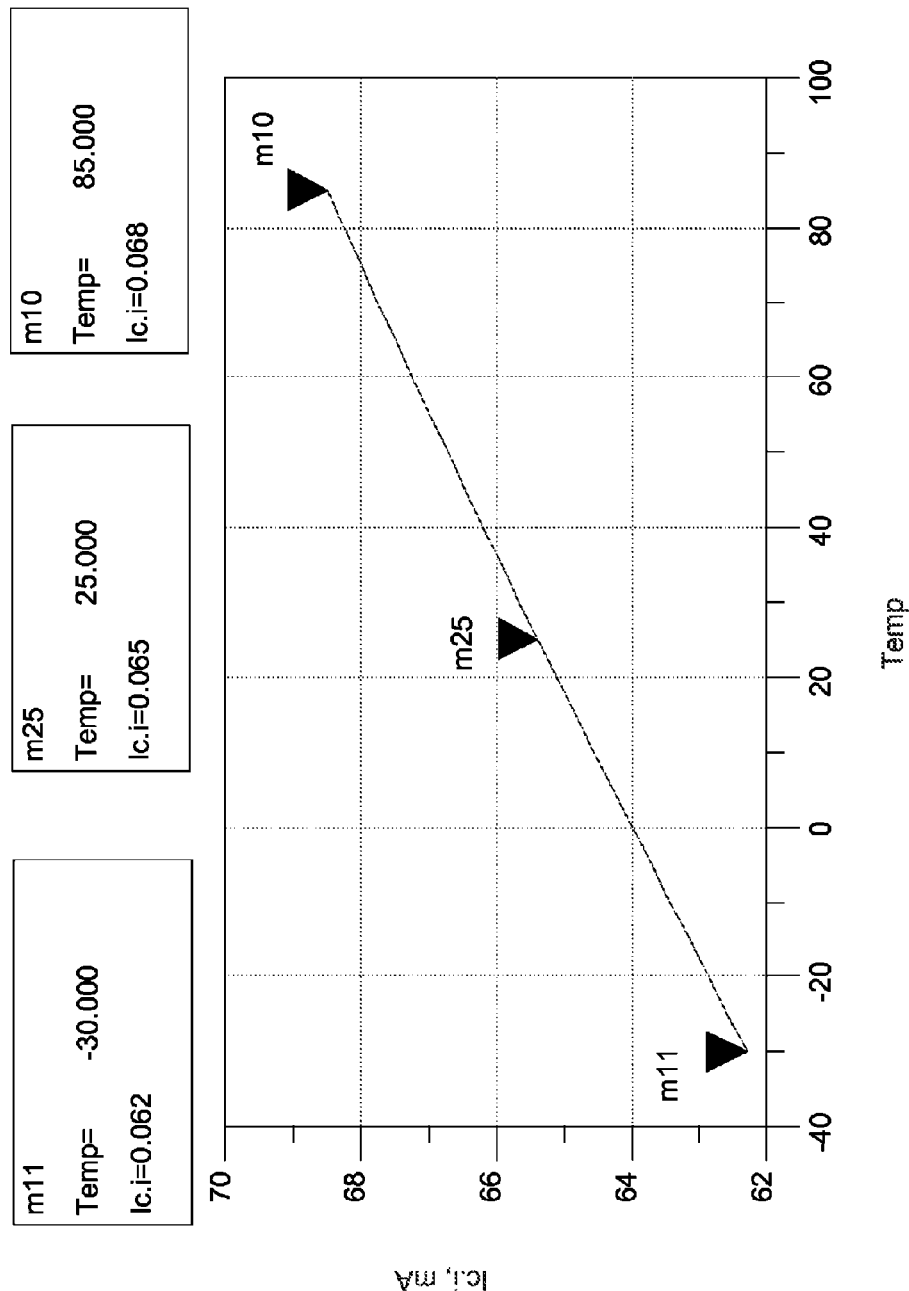
FIG. 7 illustrates the collector current versus temperature performance of one embodiment of a temperature-compensated Darlington pair amplifier such as that shown in FIG. 2.

FIG. 7 illustrates the collector current versus temperature performance of one embodiment of a temperature-compensated Darlington pair amplifier such as Darlington pair amplifier 200 shown in FIG. 2. As can be seen, over a temperature range of −30° C. to +85° C., the overall collector current (Ic1+Ic2) of first and second transistors 232 and 234 varies ≈±4.5%.

Figure 8:
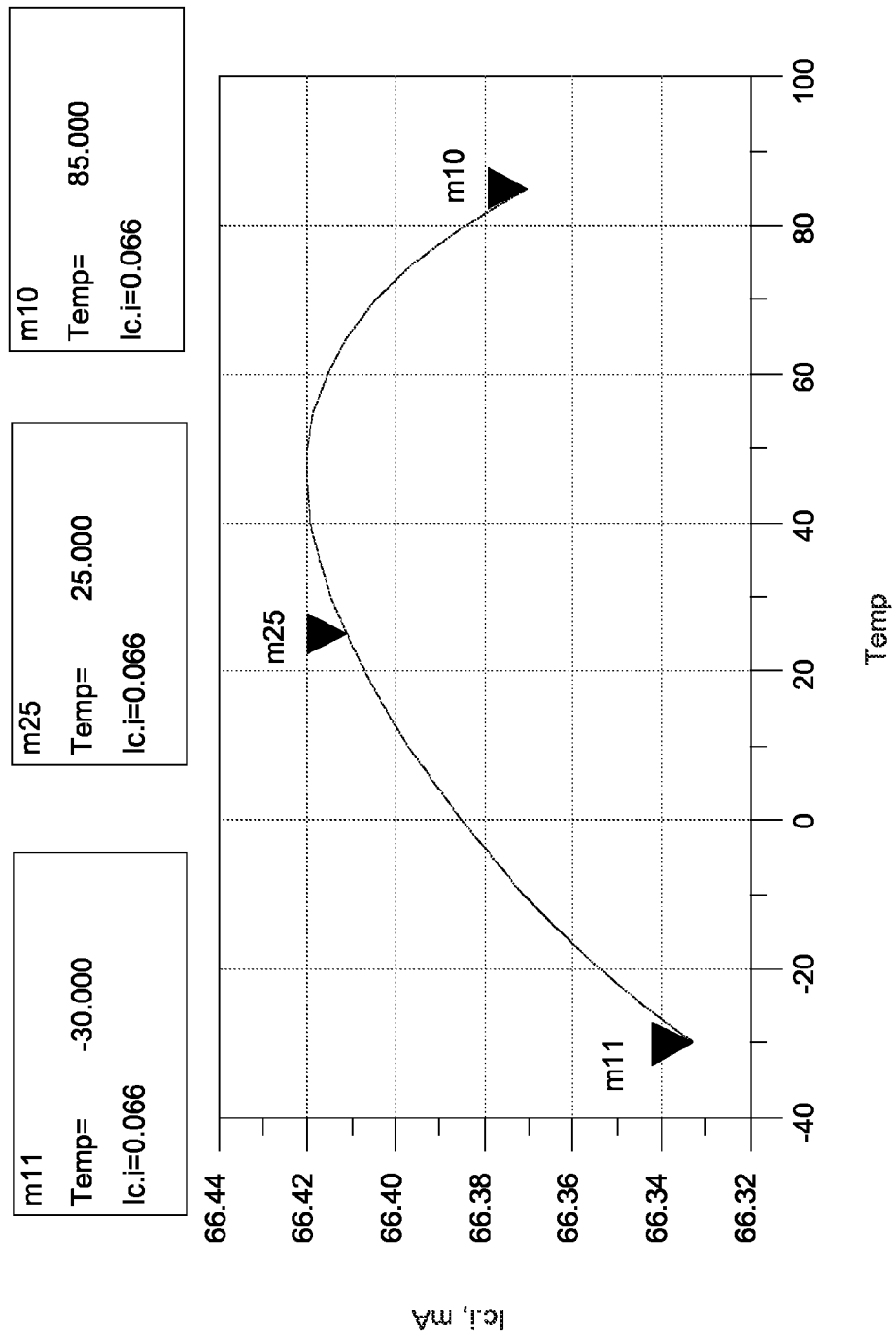
FIG. 8 illustrates the collector current versus temperature performance of one embodiment of a temperature-compensated Darlington pair amplifier such as that shown in FIG. 5.

FIG. 8 illustrates the collector current versus temperature performance of one embodiment of a temperature-compensated Darlington pair amplifier such as Darlington pair amplifier 500 shown in FIG. 5. As can be seen, over a temperature range of −30° C. to +85° C., the overall collector current (Ic1+Ic2) of first and second transistors 532 and 534 varies ≈±0.06%.

Figure 9:
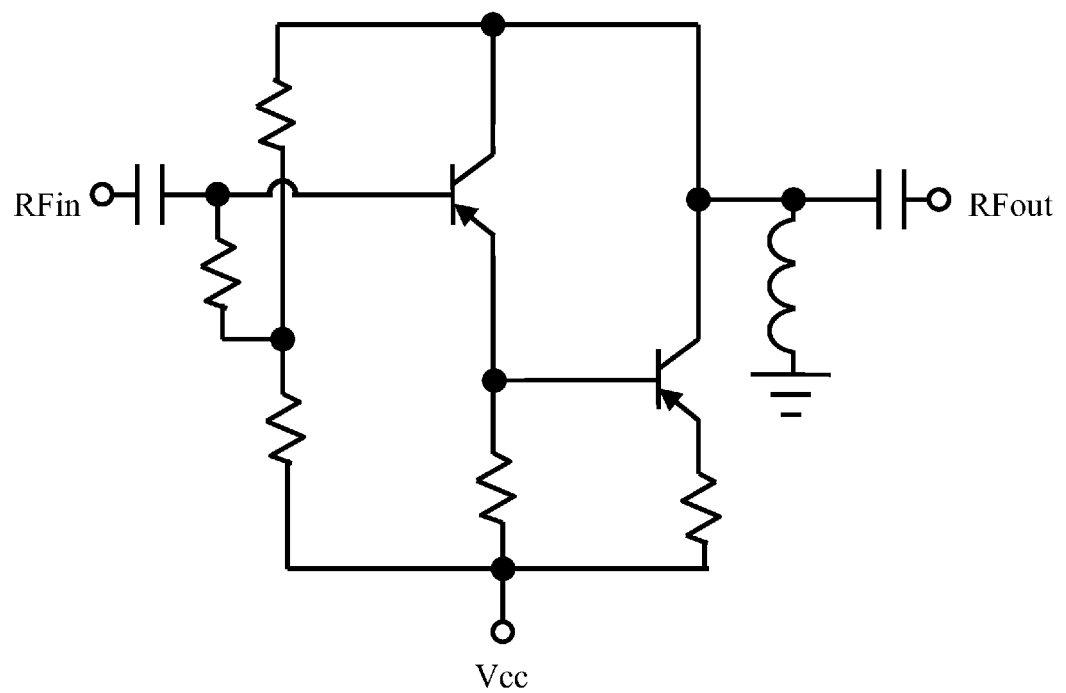
FIG. 9 shows a fourth embodiment of a temperature compensated Darlington pair amplifier.
Figure 10:
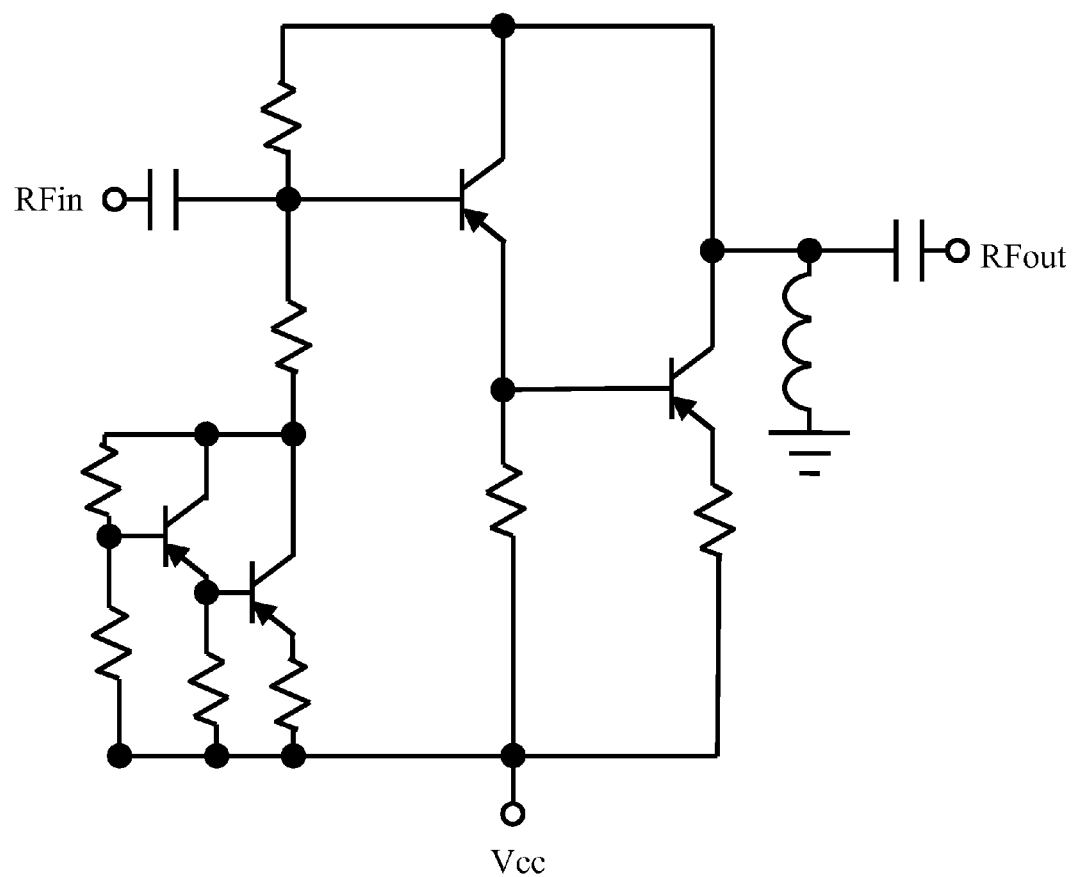
FIG. 10 shows a fifth embodiment of a temperature compensated Darlington pair amplifier.
Figure 11:
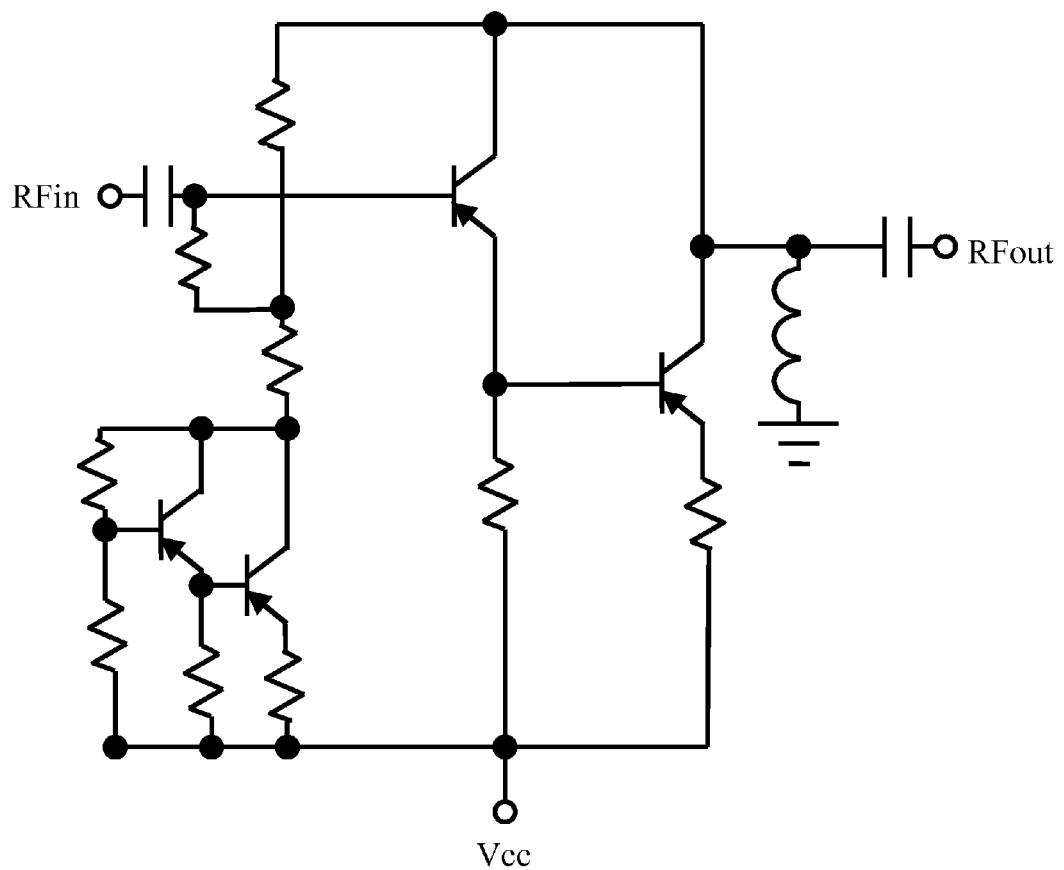
FIG. 11 shows a sixth embodiment of a temperature compensated Darlington pair amplifier.

While example embodiments are disclosed herein, one of ordinary skill in the art appreciates that many variations that are in accordance with the present teachings are possible that remain within the scope of the appended claims. For example, although the embodiments shown in FIGS. 3-5 include Darlington pairs with NPN transistors, it is understood that alternative embodiments may include Darlington pairs with PNP transistors. Examples of such embodiments are shown in FIGS. 9-11. Furthermore, additional components may be included in the Darlington pairs—for example, a resistor between the emitter of the first transistor and the base of the second transistor, and/or a resistor between the base and emitter of the second transistor. Other, similar, modifications are possible within the meaning of a "Darlington pair" as defined above and described herein. The embodiments therefore are not to be restricted except within the scope of the appended claims.

The invention claimed is:

1. A device, comprising:
    first and second transistors configured as a Darlington pair, the Darlington pair including an input node and an output node;
    first and second bias resistors connected in series between a first supply voltage and a second supply voltage, the first and second bias resistors defining an intermediate node in a current path between the first and second bias resistors; and
    a third resistor connected in series between the intermediate node and the input node of the Darlington pair.

2. The device of claim 1, wherein the first and second transistors are NPN transistors, and wherein the input node of the Darlington pair comprises a base of the first transistor, and the output node of the Darlington pair comprises a shared collector of the first and second transistors.

3. The device of claim 1, wherein the first and second transistors are PNP transistors, and wherein the input node of the Darlington pair comprises a base of the first transistor, and the output node of the Darlington pair comprises a shared collector of the first and second transistors.

4. The device of claim 1, further comprising:
    a fourth resistor connected between an emitter of the first transistor and the second power supply voltage; and
    a fifth resistor connected between an emitter of the second transistor and the second power supply voltage.

5. The device of claim 1, wherein a ratio of a sum of resistance values of the first and second bias resistors, to a resistance value of the third resistor, is about 10:1.

6. The device of claim 1, wherein a resistance value of the third resistor is from 50 to 200 ohms.

7. The device of claim 1, further comprising:
    an input terminal and an output terminal;
    a capacitor coupling the input terminal to the input node of the Darlington pair; and
    an output coupling circuit coupling the output node of the Darlington pair and the output terminal of the device.

8. A device, comprising:
    first and second transistors configured as a first Darlington pair, the first Darlington pair including a first input node and a first output node;
    first and second bias resistors connected in series between a first supply voltage and an intermediate node, wherein the first input node of the first Darlington pair is disposed in a current path between the first and second bias resistors; and
    a bias circuit, including:
        third and fourth transistors configured as a second Darlington pair, the second Darlington pair including a second input node and a second output node connected to the intermediate node, and
        third and fourth bias resistors connected in series between the intermediate node and a second power supply voltage, wherein the second input node of the second Darlington pair is disposed in a current path between the third and fourth bias resistors.

9. The device of claim 8, wherein a current flowing through the third transistor is about the same as a current flowing through the fourth transistor.

10. The device of claim 8, wherein a size of the second Darlington pair is smaller than a size of the first Darlington pair.

11. The device of claim 8, wherein the first and second transistors are NPN transistors, and wherein the first input node of the first Darlington pair comprises a base of the first transistor, and the first output node of the first Darlington pair comprises a shared collector of the first and second transistors.

12. The device of claim 8, wherein the first and second transistors are PNP transistors, and wherein the first input node of the first Darlington pair comprises a base of the first transistor, and the first output node of the first Darlington pair comprises a shared collector of the first and second transistors.

13. The device of claim 8, further comprising:
    a fifth resistor connected between an emitter of the first transistor and the second power supply voltage; and
    a sixth resistor connected between an emitter of the second transistor and the second power supply voltage.

14. A device, comprising:
    first and second transistors configured as a first Darlington pair, the first Darlington pair including a first input node and a first output node;
    first and second bias resistors connected in series between a first supply voltage and a first intermediate node, the first and second bias resistors defining a second intermediate node in a current path between the first and second bias resistors; and
    a bias circuit, including:
        third and fourth transistors configured as a second Darlington pair, the second Darlington pair including a second input node and a second output node connected to the first intermediate node, and
        third and fourth bias resistors connected in series between the first intermediate node and a second power supply voltage, wherein the second input node of the second Darlington pair is disposed in a current path between the third and fourth bias resistors; and
    a fifth resistor connected in series between the second intermediate node and the first input node of the first Darlington pair.

15. The device of claim 14, wherein a current flowing through the third transistor is about the same as a current flowing through the fourth transistor.

16. The device of claim 14, wherein a size of the second Darlington pair is smaller'than a size of the first Darlington pair.

17. The device of claim 14, wherein the first and second transistors are NPN transistors, and wherein the first input node of the first Darlington pair comprises a base of the first transistor, and the first output node of the first Darlington pair comprises a shared collector of the first and second transistors.

18. The device of claim 14, wherein the first and second transistors are PNP transistors, and wherein the first input node of the first Darlington pair comprises a base of the first transistor, and the first output node of the first Darlington pair comprises a shared collector of the first and second transistors.

19. The device of claim 14, further comprising:
   a sixth resistor connected between an emitter of the first transistor and the second power supply voltage; and
   a seventh resistor connected between an emitter of the second transistor and the second power supply voltage.

20. The device of claim 14, wherein a resistance value of the third resistor is from 50 to 200 ohms.

* * * * *